US008559478B2

(12) United States Patent
Sysak et al.

(10) Patent No.: US 8,559,478 B2
(45) Date of Patent: Oct. 15, 2013

(54) HYBRID SILICON LASER-QUANTUM WELL INTERMIXING WAFER BONDED INTEGRATION PLATFORM FOR ADVANCED PHOTONIC CIRCUITS WITH ELECTROABSORPTION MODULATORS

(75) Inventors: Matthew N. Sysak, Santa Barbara, CA (US); John E. Bowers, Goleta, CA (US); Alexander W. Fang, Santa Barbara, CA (US); Hyundai Park, Hillsboro, OR (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 12/355,628

(22) Filed: Jan. 16, 2009

(65) Prior Publication Data
US 2009/0245298 A1    Oct. 1, 2009

Related U.S. Application Data

(60) Provisional application No. 61/022,239, filed on Jan. 18, 2008.

(51) Int. Cl.
*H01S 5/026* (2006.01)
*H01L 27/14* (2006.01)
(52) U.S. Cl.
USPC ........ 372/44.01; 372/108; 438/500; 438/502; 438/518; 438/520; 438/522
(58) Field of Classification Search
USPC ............ 372/42.01, 108, 44.01; 398/518, 520, 398/522; 438/500, 502, 518, 520, 522
See application file for complete search history.

(56) References Cited

U.S. PATENT DOCUMENTS 5,673,284 A * 9/1997 Congdon et al. ............. 372/50.1

OTHER PUBLICATIONS

Skogen, "Postgrowth Control of the Quantum-Well Band Edge for the Monolithic Integration of Widely Tunable Lasers and Electroabsorption Modulators" IEEE J. Sel. Topics Quantum Electron., vol. 9, Sep./Oct. 2003, pp. 1183-1190.*
International Search Report mailed Sep. 11, 2009, International application No. PCT/US09/31338, International filing date Jan. 16, 2009.
Fang et al., "Electrically pumped hybrid AlGaInAs-silicon evanescent laser," Oct. 2, 2006, vol. 14, No. 20, pp. 9203-9210. Optics Express (online) (retrieved Aug. 24, 2009).
Jones et al., "Single wavelength hybrid silicon layers," Jan. 14, 2008, Optoelectronics & Optical Communications, SPIE Newsroom, DOI:10. 1117/2.1200812.1411 (online) (retrieved Aug. 24, 2009).

(Continued)

*Primary Examiner* — Jessica Stultz
*Assistant Examiner* — Michael Carter
(74) *Attorney, Agent, or Firm* — Kaplan Breyer Schwarz & Ottesen, LLP

(57) ABSTRACT

Photonic integrated circuits on silicon are disclosed. By bonding a wafer of compound semiconductor material as an active region to silicon and removing the substrate, the lasers, amplifiers, modulators, and other devices can be processed using standard photolithographic techniques on the silicon substrate. A silicon laser intermixed integrated device in accordance with one or more embodiments of the present invention comprises a silicon-on-insulator substrate, comprising at least one waveguide in a top surface, and a compound semiconductor substrate comprising a gain layer, the compound semiconductor substrate being subjected to a quantum well intermixing process, wherein the upper surface of the compound semiconductor substrate is bonded to the top surface of the silicon-on-insulator substrate.

26 Claims, 14 Drawing Sheets

(56) References Cited

OTHER PUBLICATIONS

Raring et al., "Quantum well intermixing for monolithic integration: a demonstration of novel widely-tunable 10Gb/s transmitters and wavelength converters," Integrated Photonics Research and Applications, Technical Digest, Optical Society of America, Paper IWC3, 2004 (online) (retrieved Aug. 24, 2009).
Bowers, J. et al., "Design of hybrid silicon evanescent amplifiers," COIN-NGN, Korea, Jul. 2006, three pages.
Bowers, J. et al., "Hybrid silicon evanescent laser," Device Research Conference 2006, University Park, PA, Jun. 20, 2006, pp. 13-14.
Bowers, J. et al., "Hybrid silicon evanescent photonic integrated circuit technology," CLEO, Invited Paper, Baltimore, MD, May 8-10, 2007, two pages.
Bowers, J. et al., "Scalable wafer bonding for photonic devices on silicon," LEOS Annual Meeting, paper TuC1, Oct. 29-Nov. 2, 2006, pp. 176-177.
Bowers, J. et al., "Silicon evanescent lasers and amplifiers," 2006 IEEE/LEOS Group IV Photonics Conference, paper TuA1, Ottawa, Canada, Sep. 13-15, 2006, pp. 185-187.
Bowers, J. et al., "Hybrid silicon evanescent laser in a silicon-on-insulator waveguide," OFC, Invited Paper, paper OtuK4, Anaheim, CA, Mar. 27-29, 2007, 29 pages.
Bowers, J. et al., "A technology for integrating active photonic devices on SOI wafers," IPRM, May 7-11, 2006, pp. 218-221.
Fang, A. et al, "A continuous wave hybrid AlGaInAs-silicon evanescent laser," IEEE Photonics Technology Letters 18(10), May 2006, pp. 1143-1145.
Fang, A. et al., "Heterogeneous integration of silicon and AlGaInAs for a silicon evanescent laser," Photonics West, Feb. 7, 2006, pp. 61330W-1-61330W-6.
Fang, A. et al., "Hybrid silicon evanescent devices," Materials Today, 2007, eight pages.
Fang, A. et al., "Integrated AlGaInAs-silicon evanescent race track laser and photodetector," Opt. Express 15(5), 2007, pp. 2315-2322.
Fang, A. et al., "Continuous wave electrically pumped hybrid silicon evanescent laser," Opt. Express Oct. 14, 2006, pp. 9203-9210.
Fang, A. et al., "An optically pumped silicon evanescent laser," 31$^{st}$ European Conference on Optical Communications (ECOC 2005), SECC, Glasgow, Scotland, Sep. 2005, pp. 57-58.
Park, H. et al., "An electrically pumped hybrid silicon evanescent amplifier," OFC, paper OtuD2, Anaheim, CA, Mar. 27-29, 2007, 29 pages.
Park, H. et al., "A hybrid AlGaInAs-silicon evanescent amplifier," IEEE Photonics Technology Letters 19(4), Feb. 2007, pp. 230-232.
Park, H. et al., "A hybrid AlGaInAs-silicon evanescent waveguide photodetector," Opt. Express 15(10), May 2007, pp. 6044-6052.
Park, H. et al., "Hybrid silicon evanescent laser fabricated with a silicon waveguide and III-V offset quantum wells," Opt. Express 13(23), Nov. 2005, pp. 9460-9464.
Park, H. et al., "An optically pumped silicon evanescent laser operating continuous wave at 60C," paper OWH2, Optical Fiber Communication Conference (OFC '06), Mar. 2006, three pages.
Skogen, E., "Quantum well intermixing for wavelength-agile photonic integrated circuits," Ph.D. Thesis, University of California, Santa Barabara, Jun. 2003, 199 pages.
Sysak, M. et al., "Broadband return to zero (RZ) signal regeneration and wavelength conversion using a monolithically integrated, photocurrent driven wavelength converter," IEE Electronics Lett., vol. 42, No. 25, Dec. 2006, three pages.
Sysak, M. et al., "Single-chip, wideley-tunable 10 Gbps photocurrent-driven wavelength converter incorporating a monolithically integrated laser transmitter and optical receiver," IEE Electronics Lett., vol. 42, No. 11, May 2006, pp. 657-658.
Bowers, J. et al., "Silicon photonics," IEDMS Plenary Talk, Tainen, Taiwan, Dec. 7, 2006.
Bowers, J., "Integrated optical amplifiers on silicon waveguides," IPNRA, Invited Paper, Goteborg, Sweden, Jul. 8-13, 2007.
Kodama, S. et al., "Novel laser diode structure consisting of a Si waveguide and compound-semiconductor MQW layers for Si platform integration," Proceedings of International Conference on Solid State Devices and Materials, Kobe, Japan, Sep. 12-15, 2005.
Liang, D. et al., "Low temperature wafer bonding for III-V Si photonic integrated circuits," EMC 2007, Notre Dame, IN, Jun. 20-22, 2007.
Park, H. et al., "40° C continuous-wave electrically pumped hybrid silicon evanescent laser," IEEE 20$^{th}$ International Semiconductor Laser Conference, paper PD1.3, Kohala, Hawaii, Sep. 17-21, 2006.
"Related Chinese Patent Application No. 200980102511.1 Office Action, as translated by Lee and Li", Jan. 5, 2013, Publisher: CIPO, Published in: CN.

\* cited by examiner (a) Quantum Well Intermixing (b) Holographic grating procedure

US 8,559,478 B2

HYBRID SILICON LASER-QUANTUM WELL INTERMIXING WAFER BONDED INTEGRATION PLATFORM FOR ADVANCED PHOTONIC CIRCUITS WITH ELECTROABSORPTION MODULATORS

CROSS-REFERENCE TO RELATED APPLICATIONS

This application claims the benefit under 35 U.S.C. §119 (e) of U.S. Application Ser. No. 61/022,239, filed on Jan. 18, 2008, by Matthew N. Sysak et al., entitled "HYBRID SILICON LASER-QUANTUM WELL INTERMIXING WAFER BONDED INTEGRATION PLATFORM FOR ADVANCED PHOTONIC CIRCUITS WITH ELECTROABSORPTION MODULATORS," which application is incorporated by reference herein.

STATEMENT REGARDING FEDERALLY SPONSORED RESEARCH OR DEVELOPMENT

This invention was made with Government support under Grant No. W911NP-06-1-0496 awarded by the U.S. Army and Grant No. FA 8750-05-C-0265 from the U.S. Air Force. The Government has certain rights in this invention.

BACKGROUND OF THE INVENTION

Description of the Related Art

Semiconductor chip level bonded devices have found uses in several consumer and commercial applications. Typically, semiconductor devices are made from a single type of material, or different types of material are grown onto a substrate based on lattice matching and compatible crystalline structures. Devices manufactured from III-V materials are typically grown on gallium arsenide or other compound semiconductor substrates. These devices are difficult to integrate with electronic devices fabricated on silicon.

BRIEF DESCRIPTION OF THE DRAWINGS

Referring now to the drawings in which like reference numbers represent corresponding parts throughout:

FIG. 4A illustrates the quantum well intermixing process and FIG. 4B illustrates the holographic grating process in accordance with the present invention;

DETAILED DESCRIPTION OF THE PREFERRED EMBODIMENTS

Figure 1:
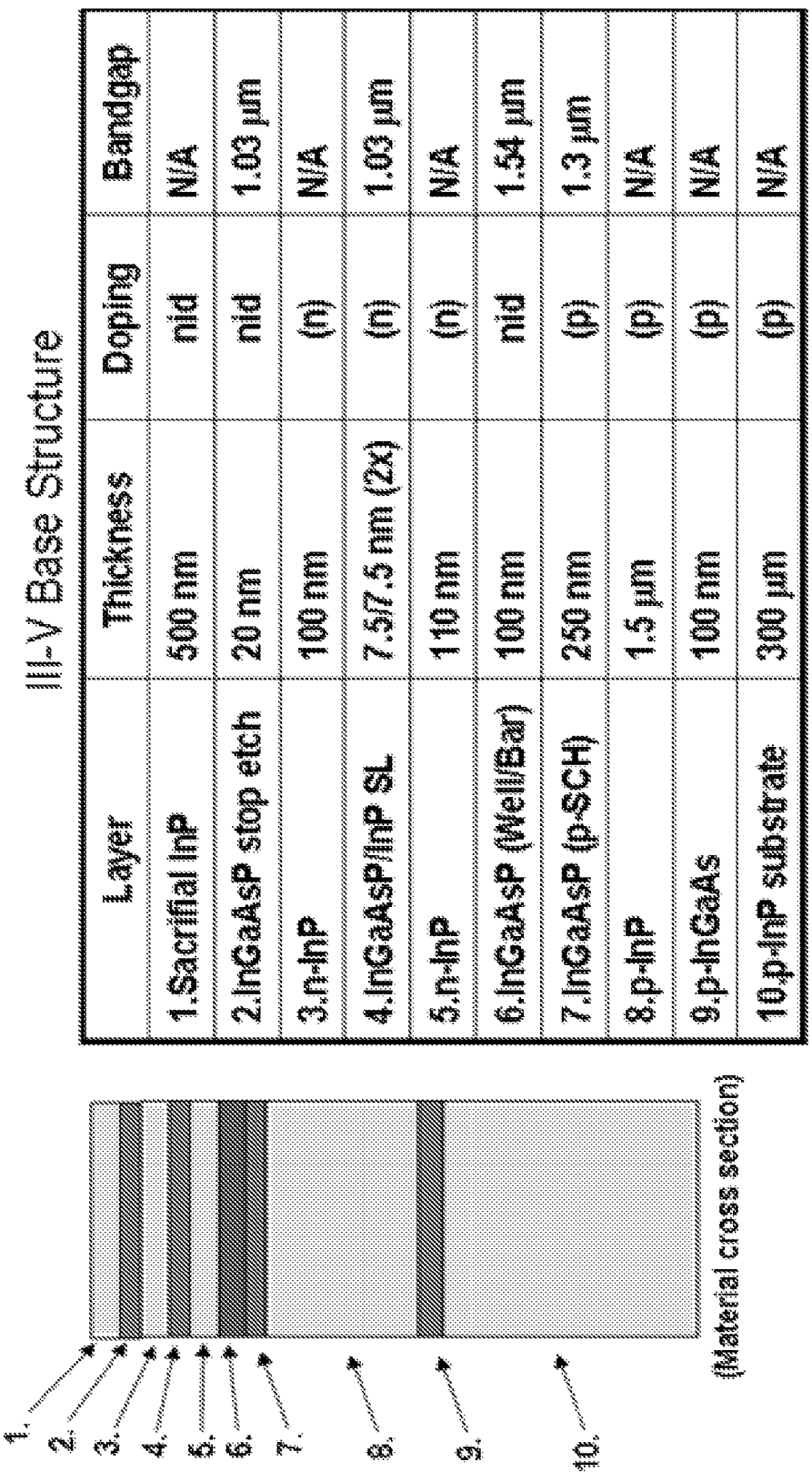
FIG. 1 is a cross-sectional view of a InGaAsP/InP base structure for the SL-QWI integration platform of the present invention.

In the following description, reference is made to the accompanying drawings which form a part hereof, and which is shown, by way of illustration, several embodiments of the present invention. It is understood that other embodiments may be utilized and structural changes may be made without departing from the scope of the present invention.

Integrating electronic and photonic devices on a single substrate has several potential advantages. Passive photonic devices such as arrayed waveguide routers (AWG) are commonly fabricated on silicon. Some active photonic devices have been demonstrated on silicon such as modulators and Raman lasers. However, most active photonic devices require single crystal material, which is difficult to grow on silicon because of the large lattice mismatch between the semiconductor with the proper bandgaps and silicon itself. The problem with the present discrete photonic devices is that the performance can be improved with integration, and the cost and size is much smaller. Silicon is a preferred semiconductor material, because it is easily processed, it is readily available for reasonable cost and high quality, and complex VLSI electronic circuits are readily available. However, silicon-based modulators or lasers or other photonic devices are not as efficient as their III-V based counterparts. It can be seen, then, that a larger scale integration between III-V materials and silicon may provide cost and efficiency advantages.

Overview

Some embodiments of the invention comprise a novel hybrid Silicon Laser-Quantum Well Intermixing (SL-QWI) integration platform for monolithically integrating InP based photonic devices together with low loss silicon photonics and CMOS electronics. Device fabrication is straightforward and requires only standard lithography techniques in some embodiments.

First, a set of optical waveguides is patterned on a silicon-on-insulator (SOI) wafer. Next, an InGaAsP/InP wafer that includes a set of Quantum Wells (QWs) for optical gain, is subjected to a well-defined quantum well intermixing process. The intermixing process allows the emission wavelength of the QWs to be shifted at various locations on the wafer where passive waveguide regions, mirror regions, modulator regions, or gain regions are desired.

Gratings are then patterned in the mirror regions (wafer top side-opposite substrate) using a well established holographic exposure technique. A shallow etch is used to transfer the holographic exposure pattern to the mirror regions in the top side of the InP wafer. The patterned face of the InP wafer is then wafer bonded to the patterned face of the SOI wafer using a low temperature plasma assisted bonding process.

The bonding requires only coarse rotational alignment to ensure that the pre-patterned gratings are orthogonal to the optical waveguides on the SOI wafer. Following the bonding, the InP substrate is removed and the p-contact and n-contact layers in the InGaAsP/InP are lithographically exposed and metallized. Current injection is used for optical gain in non-intermixed regions, and for index tuning in highly intermixed grating regions. A reverse bias is applied to regions that have been partially intermixed for modulators, and for gain regions that operate as photodiodes. Electrical isolation between gratings, gain regions, photodiodes, and modulators is performed using a proton implant step. By integrating grating sections, optical gain regions, amplifiers, and photodetectors together with electroabsorption modulators, this platform opens the door for a wide variety of photonic integrated circuits, e.g., tunable laser transponders, wavelength converters, tunable lasers, pre-amplified photodetectors, etc., that were previously unavailable using a simple InP-based wafer bonding approach.

This approach for fabrication of advanced photonic integrated circuits can provide a number of unique advantages in various embodiments. The SL-QWI platform may enable a wide range of InP-based functionalities (modulators, lasers, amplifiers) to be preformed in an SOI based platform without discrete laser placement or MOCVD growth. Previous attempts at combining external modulation with Si photonics have required placement of discrete lasers individually. This is very time consuming and translates into high cost in the end product. As an alternative, many photonic integrated circuits are fabricated using InP based substrates where it is straightforward to integrate modulators and laser together. However, these approaches require multiple growth and/or regrowth steps, which have detrimental effects on device yield. Furthermore, InP substrates do not have the mechanical stability that is available for Si based material. Although there have been some reports of modulator effects using strained silicon and SiGe quantum wells, it is not possible to integrate these modulators together with lasers currently in a single integration platform. Furthermore, the modulation effects that were observed in the strained silicon are very weak, or have inherently large insertion loss. The present invention is the first time an integration platform is proposed that can combine integrated, small form factor electroabsorption modulators together with lasers and other InP photonic functionalities in a Si-based integration platform.

Embodiments of the invention comprise a novel Hybrid Silicon Laser-Quantum Well Intermixing (SL-QWI) integration platform for photonic circuits used in telecommunications and in chip-to-chip interconnect applications. This integration approach is highly unique because it allows wafer scale fabrication of advanced photonic circuits that require electroabsorption modulators in a silicon photonics integration platform. Previous integration platforms that offered this functionality either required complex growth and/or regrowth steps, or required a hybrid InP-based laser with a Mach-Zehnder Si modulator. Generally, MZI modulators are large, are sensitive to thermal effects, and can consume significant physical space on a Si wafer. Other common alternatives to combining an external modulator and laser source have previously required individual placements of each laser component. This is both time consuming and costly. The SL-QWI platform enables electroabsorption modulators to be fabricated in a wafer-scale process in combination with lasers, amplifiers, and photodetectors.

Figure 2:
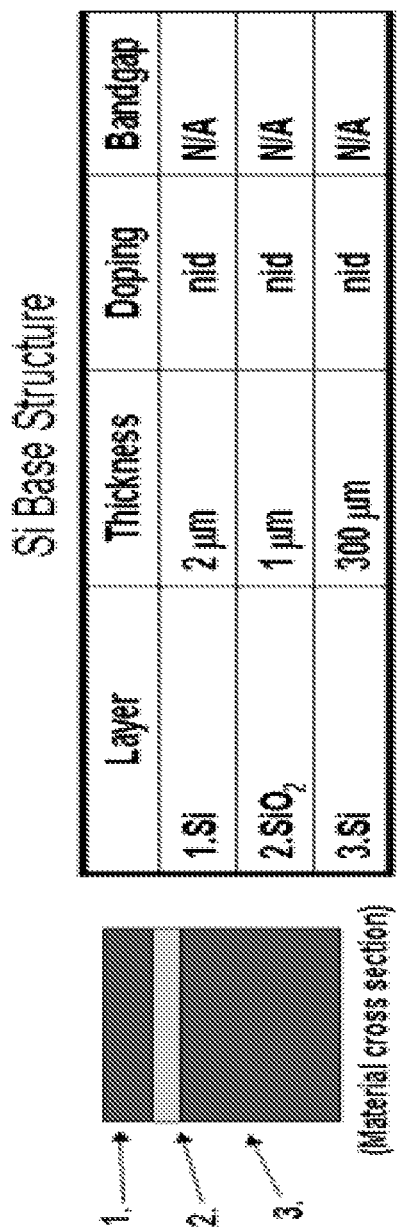
FIG. 2 is a cross-sectional view of the SOI wafer base structure for the SL-QWI integration platform of the present invention.

The Silicon-on-Insulator (SOI) and InP/InGaAsP base structures that are used in the fabrication process are shown in FIGS. 2 and 1, respectively. The SOI wafer (from substrate) comprises a Si substrate followed by a Silicon Dioxide ($SiO_2$) layer and a thin layer of silicon (<1 micron). The InP/InGaAsP base structure (from substrate) is grown by MOCVD on a p-type InP substrate. Above the substrate layer is a 100 nm thick p-type InGaAs layer that is highly doped followed by a p-type InP cladding layer that is 2 microns thick. Above the cladding layer is a separate confined heterostructure (SCH) layer that is used for carrier confinement in laser and other forward biased regions. Above the SCH layer are a set of quantum wells and barriers that are used for optical gain. Above the quantum wells is an n-type InP layer followed by a superlattice of InGaAsP and InP which is used to block only defects that are generated after the bonding process. Following the superlattice layers is another n-type InP contact layer. Finally, above the contact layer is a 15 nm thick stop etch layer followed by a 500 nm sacrificial InP layer.

Fabrication of SL-QWI photonic circuits that include electroabsorption modulators is straightforward and can be divided into three distinct sections. The first fabrication section involves patterning Si waveguides into the SOI wafer, performing the quantum well intermixing process on the InP/InGaAsP wafer, and patterning shallow gratings in the InGaAsP/InP wafer.

The second fabrication section is the well established plasma assisted bonding step that has been implemented for other types of devices including evanescently coupled lasers. Following the bonding the third section involves electrically isolating various regions in the photonic circuit, including a low-K dielectric for low capacitance EAMS, and defining metal contacts for both p and n regions in the InGaAsP/InP wafer.

Patterning Waveguides: Section 1

Figure 3:
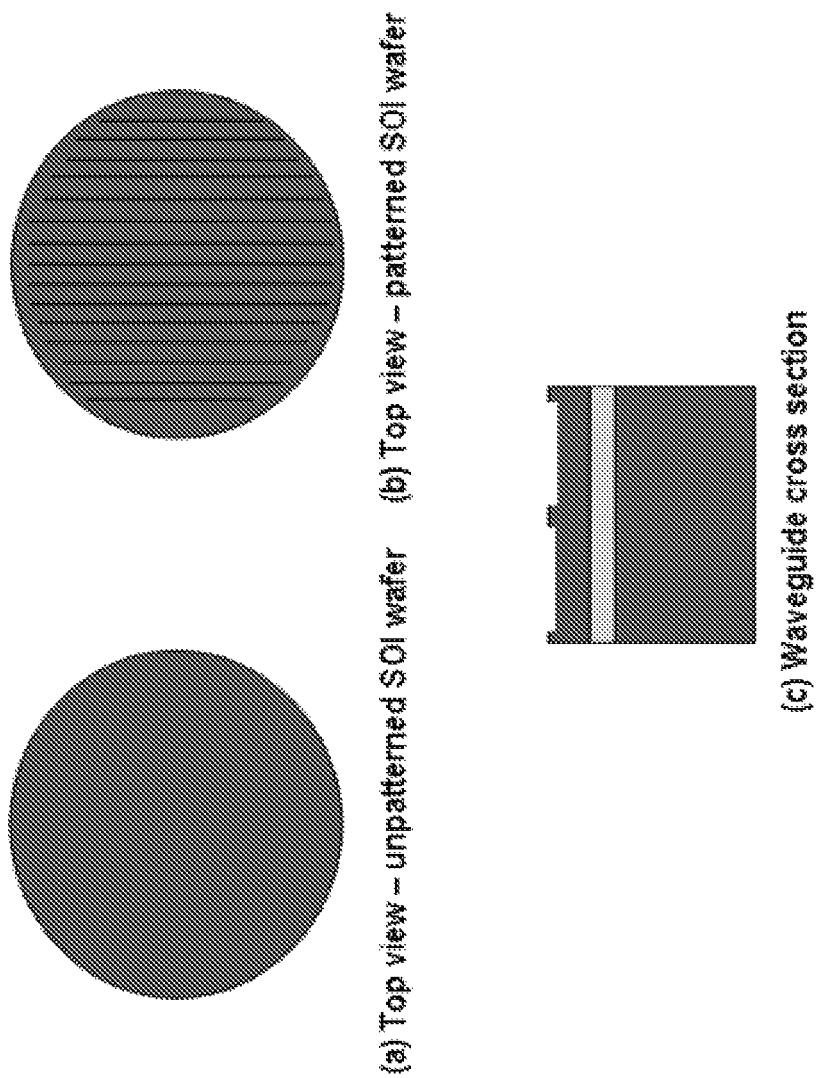
FIG. 3 illustrates the pre-bond process steps for the SOI wafer of FIG. 2, showing a top view of the unpatterned SOI wafer, a top view of the patterned SOI wafer, and a cross section of the shallow etched SOI waveguide in accordance with the present invention.
Figure 4A:
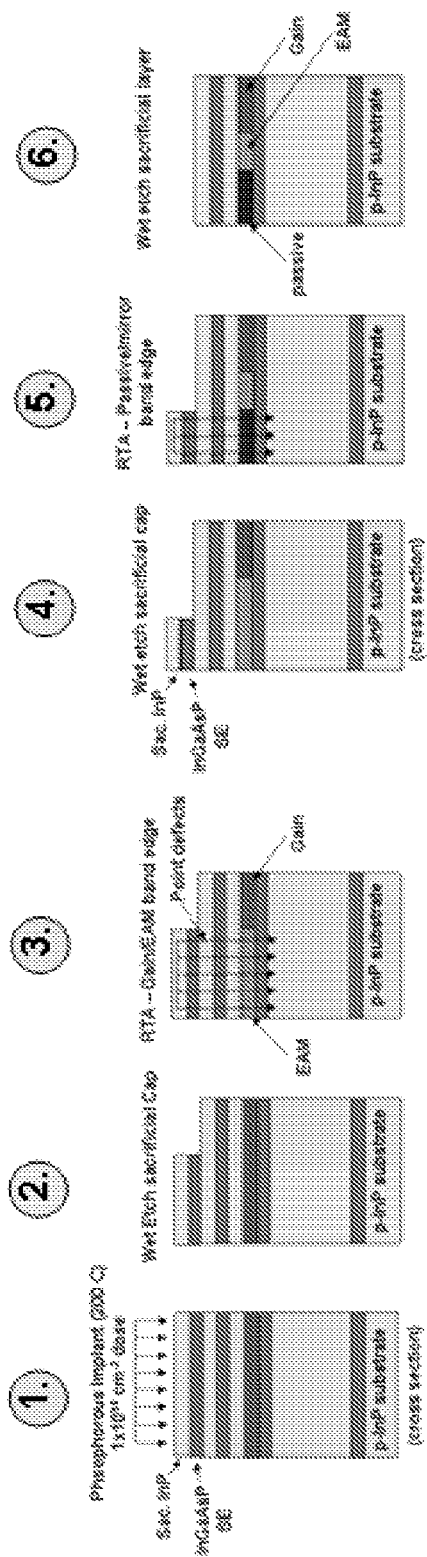
FIGS. 4A and 4B illustrate the process steps for the InGaAsP/InP wafer before plasma assisted wafer bonding.
Figure 4B:
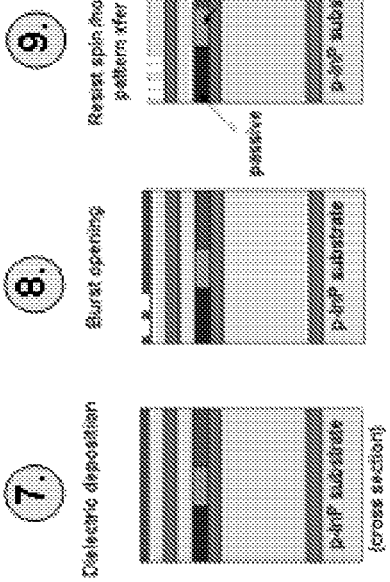

Fabrication section 1 is outlined in FIGS. 3 and 4. First, a shallow etch is made in the SOI wafer to define waveguides using a standard CMOS process. This step is followed by a QWI process (Shown in FIG. 4) that is performed on the InGaAsP wafer. The intermixing process begins with a blanket implementation of a sacrificial InP layer at 200 C with phosphorus atoms (step 1). The implant energy and dose are selected such that the point defects generated by the implantation process are confined to the 500 nm InP buffer layer. Following the implantation, a selective wet etch using 3:1 HCl/H3PO4 is performed to remove the buffer layer down to the InGaAsP stop etch layer in regions where optical gain will be desired (step 2). The InP/InGaAsP wafer is then encapsulated in Silicon Nitride (SiNx) dielectric and subjected to a high temperature Rapid Thermal Annealing (RTA) (step 3). The RTA step activates the defects generated by the implantation step. These defects diffuse down to the quantum well (gain) regions, and cause the group V elements in the wells and barrier to interdiffuse. This interdiffusion process modifies the shape of the quantum wells/gain regions, changing the standard square shape (as grown) structures into parabolic QWs. The modification of the well shape moves the lowest energy state in these wells to higher bandgaps (lower wavelengths). A more detailed discussion of this process can be found in [1]. Once the desired interdiffusion, or bandgap, has been reached, the process can be halted by removing the sacrificial InP 500 nm buffer layer. For electroabsorption modulator regions, the bandgap can be halted at 1490 nm, from a starting wavelength of 1540 nm. After removing the buffer layer above the EAM regions, the intermixing process can be continued until the desired bandgap is reached for the passive or mirror regions (1400 nm) (steps 4-6).

After the various bandgap regions have been defined, the InGaAsP wafer is patterned for gratings (steps 7-9). In the regions that have been shifted the farthest (mirror, passive), the dielectric (SiNx) mask is selectively patterned and burst windows associated with tunable sampled grating DBR lasers [3] are opened using a dielectric etch. Gratings are then defined in the burst opening using a wafer scale holographic process and etched with methane hydrogen argon plasma.

Bonding: Section 2

Fabrication section 2 is described in detail in [2]. The InGaAsP/InP and Si wafers are subjected to an oxygen plasma and the patterned face of the InP wafer is bonded to the patterned face of the SOI wafer. Bonding is performed under pressure and temperature for 12 hours. Though no precise alignment between the wafers is required, coarse rotational alignment is used to orient the gratings on the InP wafer orthogonal to the Si waveguides.

Electrical Isolation: Section 3

Figure 5:
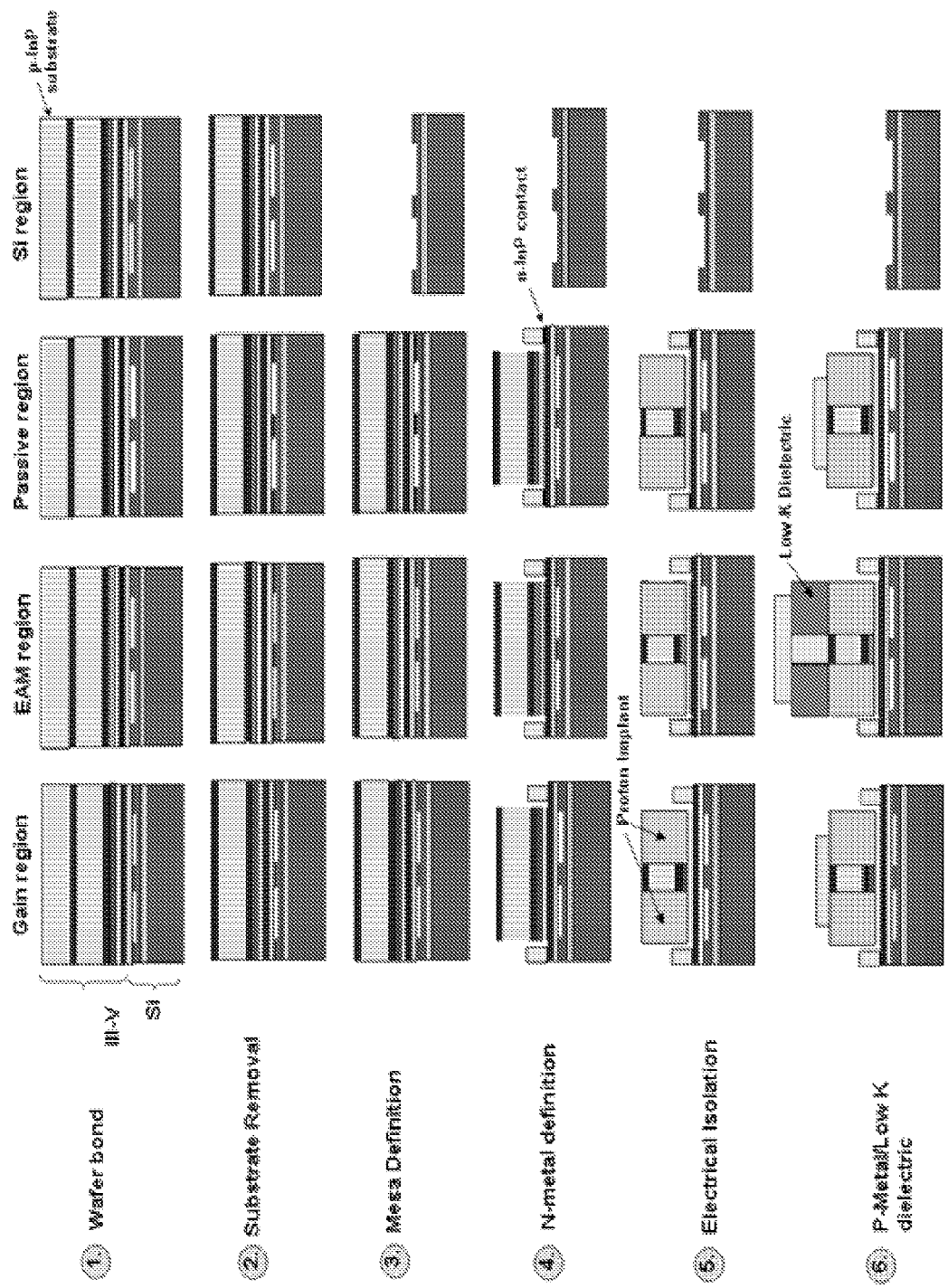
FIG. 5 illustrates a cross sectional view of various regions in a tunable transmitter throughout post-bond III-V processing in accordance with the present invention.
Figure 7:
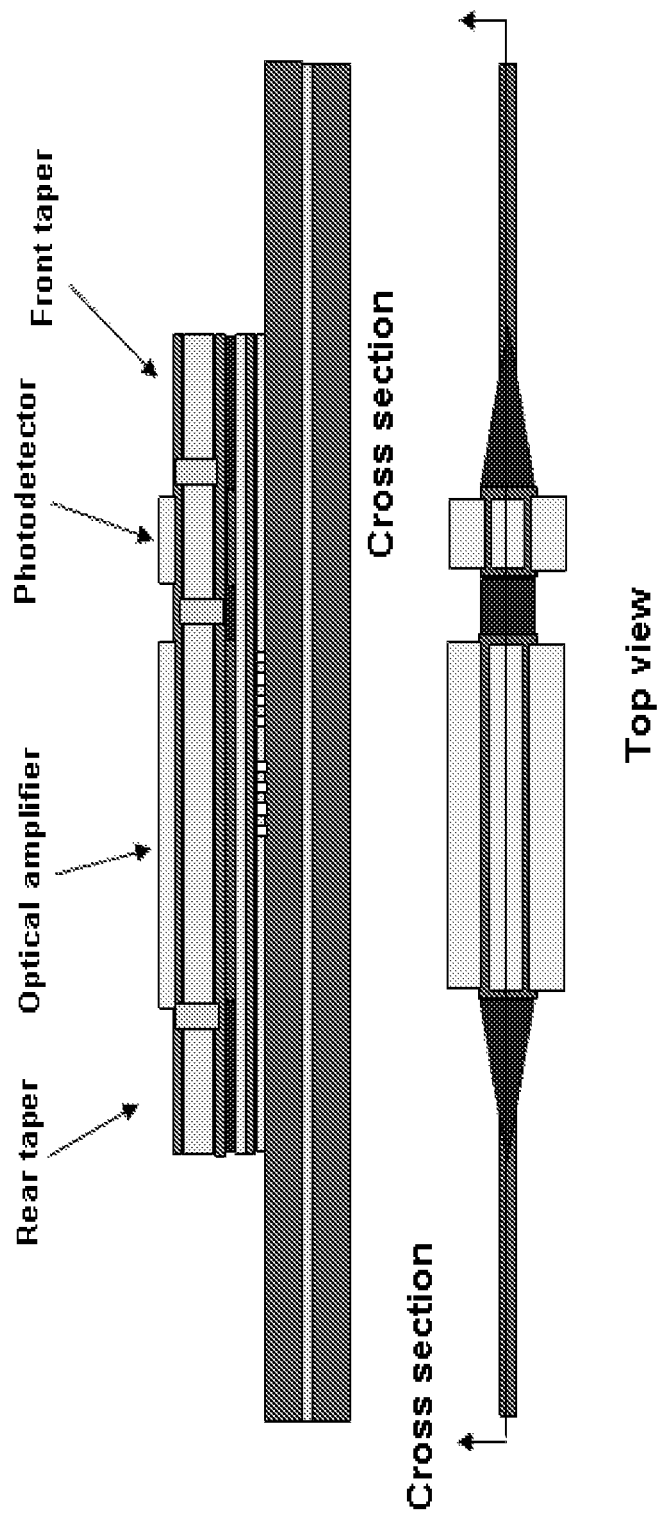
FIG. 7 illustrates a top view and a cross sectional view of an integrated pre-amplified receiver in accordance with the present invention.

Section 3 is outlined in FIG. 5. After bonding, the p-type InP substrate is removed and InGaAsP/InP mesa regions are formed as shown in FIG. 7. After mesa definition, N-metallization is performed followed by a proton implantation step for electrical isolation and for low capacitance Electroabsorption Modulators (EAMs). The proton implantation is followed by implementation of low-K dielectrics, such as bisbenz-cyclobutene (BCB), for additional low capacitance in the EAMs. Finally, p-type metallization and n-type metallization is performed to contact p and n regions. Samples are then diced into pieces and facets are polished and anti-reflection coated for low back reflection into the integrated lasers.

Figure 6:
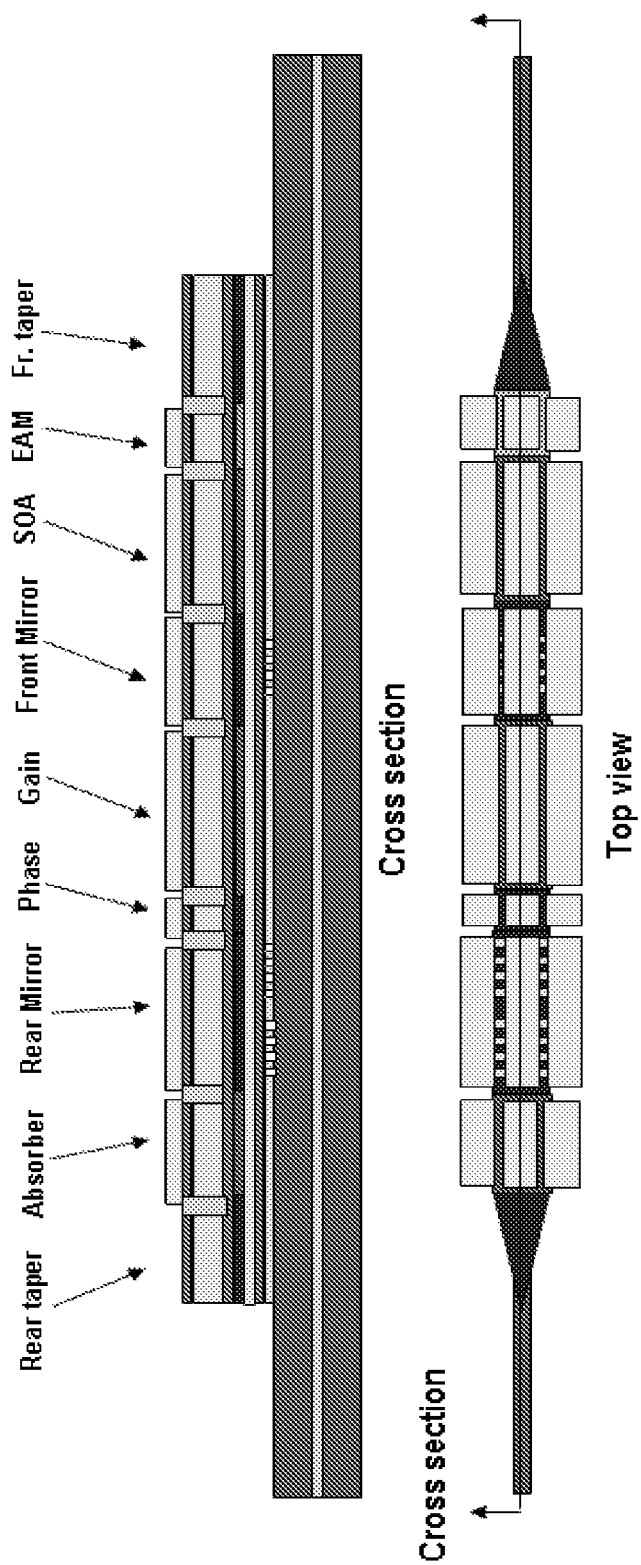
FIG. 6 illustrates a tunable transmitter including a Widely Tunable Sampled Grating DBR laser, semiconductor optical amplifier, and electroabsorption modulator in accordance with the present invention.

An embodiment of a device that utilizes the SL-QWI integration platform is an in-plane widely tunable laser integrated with an SOA and EAM in a transmitter arrangement. The structure is shown in FIG. 6 where a widely tunable, four section sampled grating DBR laser, SOA and EAM are fabricated in a single exposed ridge architecture. Light from the laser is amplified by the SOA and fed into the EAM for data processing. Using the gratings patterned in the InP wafer allows for efficient integration of mirror regions without additional processing in the silicon wafer. The integration of the backside absorbing region in the transmitter can eliminate the possibility of back-reflections from the facet at the back mirror. The taper regions at the input and output of the tunable transponder can allow the light to be efficiently transferred from partially in the III-V region to fully in the Si region without back-reflections into the laser.

The embodiment shown in FIG. 6 is a tunable transmitter including a Widely Tunable Sampled Grating DBR laser (absorber, rear mirror, phase, gain, front mirror), Semiconductor optical amplifier and electroabsorption modulator. The gold color on the top of the device in the top view is both n and p-metalization layer as described previously. The various colors under the metal in this view are an indication of the bandgap of each region after the quantum well intermixing process. The cross sectional view shows both the Silicon (green) and InP (blue) wafer bonded together. Grey regions in the cross section indicate where proton implantation has been performed to separate various laser and modulator functionality.

Figure 8:
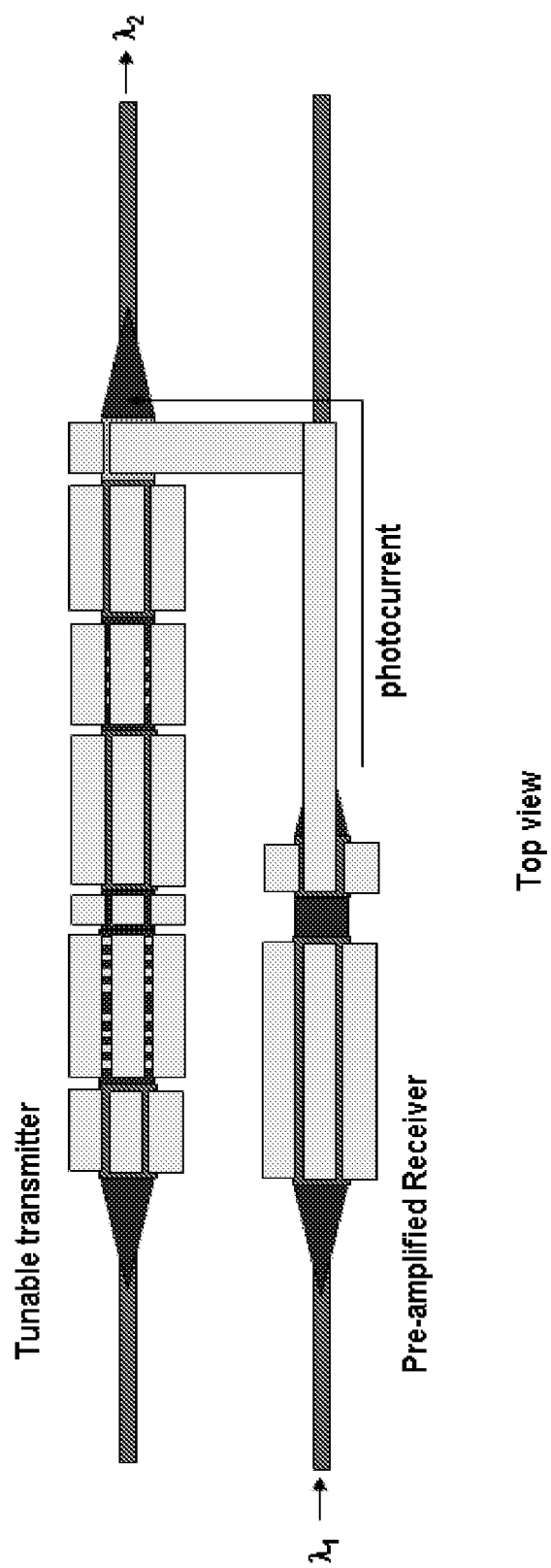
FIG. 8 illustrates a top view and a cross sectional view of an integrated photocurrent driven wavelength converter in accordance with the present invention.

Another embodiment of a monolithically integrated device using this platform is a simple photodetector and SOA fabricated on a single chip for high power pre-amplified receiver applications. The structure for such a device is shown in FIG. 8, where light from an external fiber is coupled into an SOA containing both offset and centered QWs, amplified by an SOA and in turn fed to a photodetector comprising reverse biased amplifier regions. In previous approaches for such a device, separate waveguides for detector and amplifier have been employed, and high saturation powers have been achieved using a complicated growth structure using Avalanche Photodiodes (APD) or Uni-Traveling-Carrier (UTC) photodetectors.

In another embodiment of a device that uses the SL-QWI platform, a wavelength converter described in [4] could also include a second EA modulator on the transmitter portion of the device. This second modulator can be used as a carving modulator to include re-timing functionality into the integrated wavelength converter. An outline of such a device is shown in FIG. 8.

Additional Structures

Other substrates, such as silicon without an insulator, can be used within the scope of the present invention. Silicon photonics as an integration platform is a focus of research because of the promise of low cost manufacturing for such devices. Silicon has an indirect bandgap and hence does not emit significant amounts of light when driven electrically or optically. Silicon's indirect bandgap has been a key hurdle for achieving optical gain elements. Raman lasers and amplifiers have been demonstrated, and optical gain in nanopatterned silicon have been observed, but an electrically pumped all-silicon gain element has not yet been achieved prior to the present invention.

To overcome the indirect bandgap problem, the insulator layer is used as an element of the overall structure. The insulator layer of the SOI wafer provides the optical confinement on the lower side of the waveguide.

Figure 9:
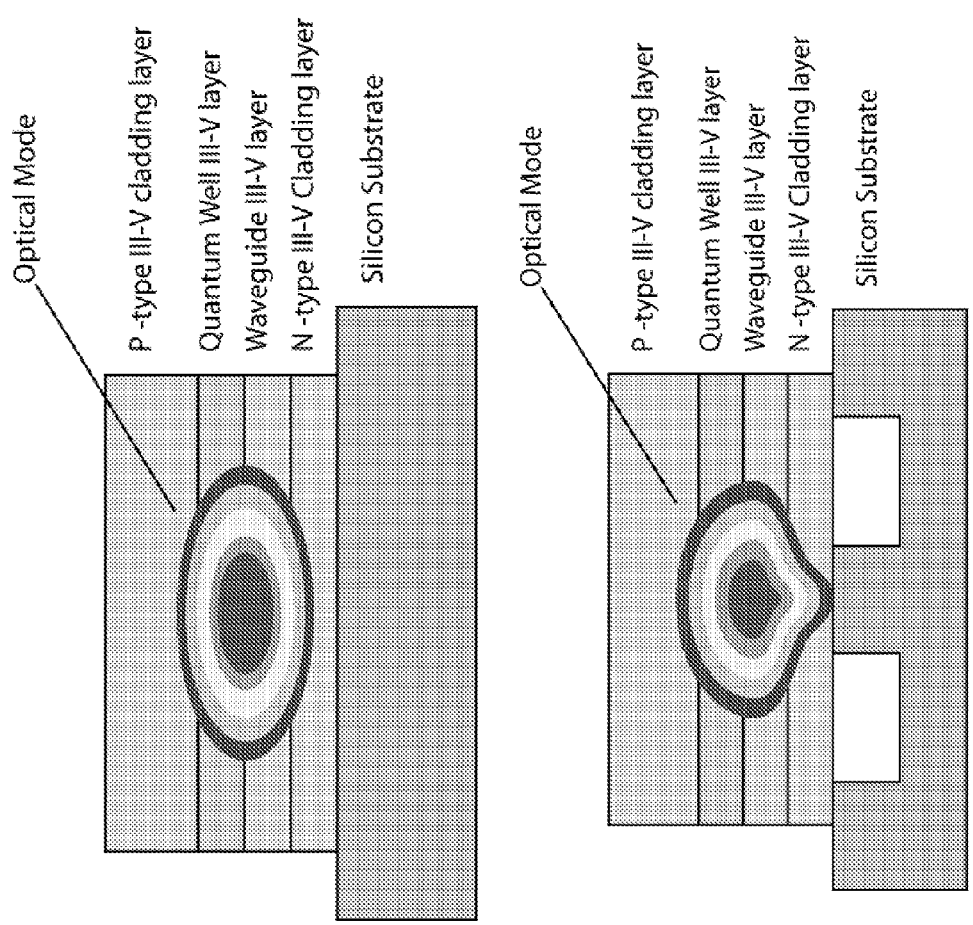
FIG. 9 illustrates a waveguide layer in the III-V material instead of in the silicon layer in accordance with the present invention.

Another solution within the scope of the present invention is to provide a waveguide layer in the III-V material instead of in the silicon layer. This is shown in FIG. 9. In this case, the silicon wafer is acting as a cladding. The III-V layer can be placed adjacent to the silicon layer as in silicon evanescent lasers. However, when integrated devices are desired, it may become necessary to etch away the absorbing quantum well layers, and then the waveguiding core is lost.

Figure 10:
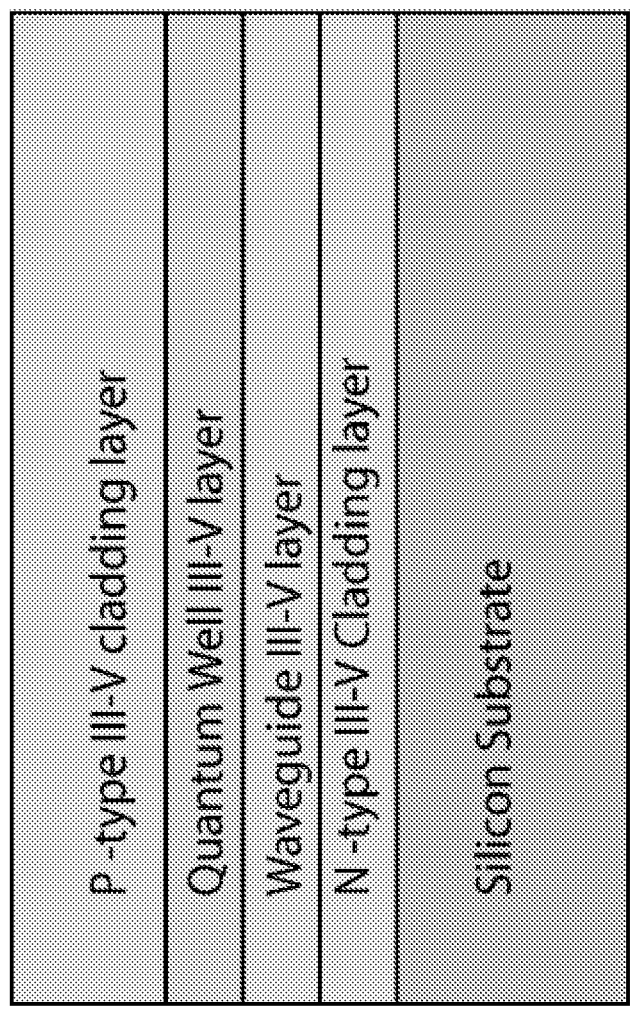
FIG. 10 illustrates a III-V waveguide layer placed between the silicon layer and the quantum well gain region in accordance with the present invention.

To allow for integrated III-V waveguides and silicon devices, the III-V waveguide layer can be placed between the silicon layer and the quantum well gain region, as long as the index of the III-V waveguiding layer is higher than that of silicon. Then, when the quantum well layers are etched off, the mode will still be guided, and coupling between the gain and the absorber regions and passive waveguides will remain strong. This approach is shown in FIG. 10.

Figure 11:
FIG. 11 illustrates a waveguiding layer above the quantum well layer after the etching of the quantum wells for the passive regions in accordance with the present invention.

Another approach would be to regrow a waveguiding layer above the quantum well layer after the etching of the quantum wells for the passive regions as shown in FIG. 11.

Figure 12:
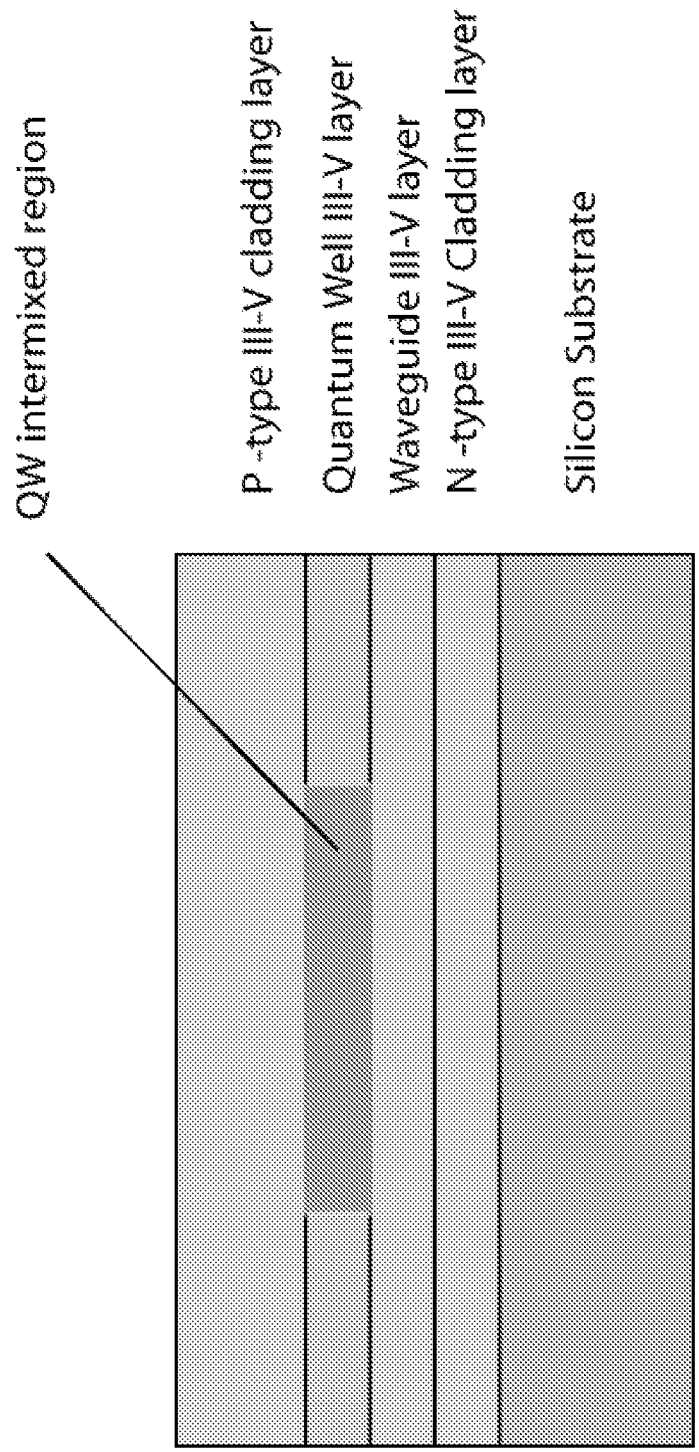
FIG. 12 illustrates a quantum well intermix of the regions where passive waveguides are desired in accordance with the present invention.

Another approach would be to quantum well intermix the regions where passive waveguides are desired, as shown in FIG. 12. Other intermixing approaches, such as impurity disordering, are also possible within the scope of the present invention.

Figure 13:
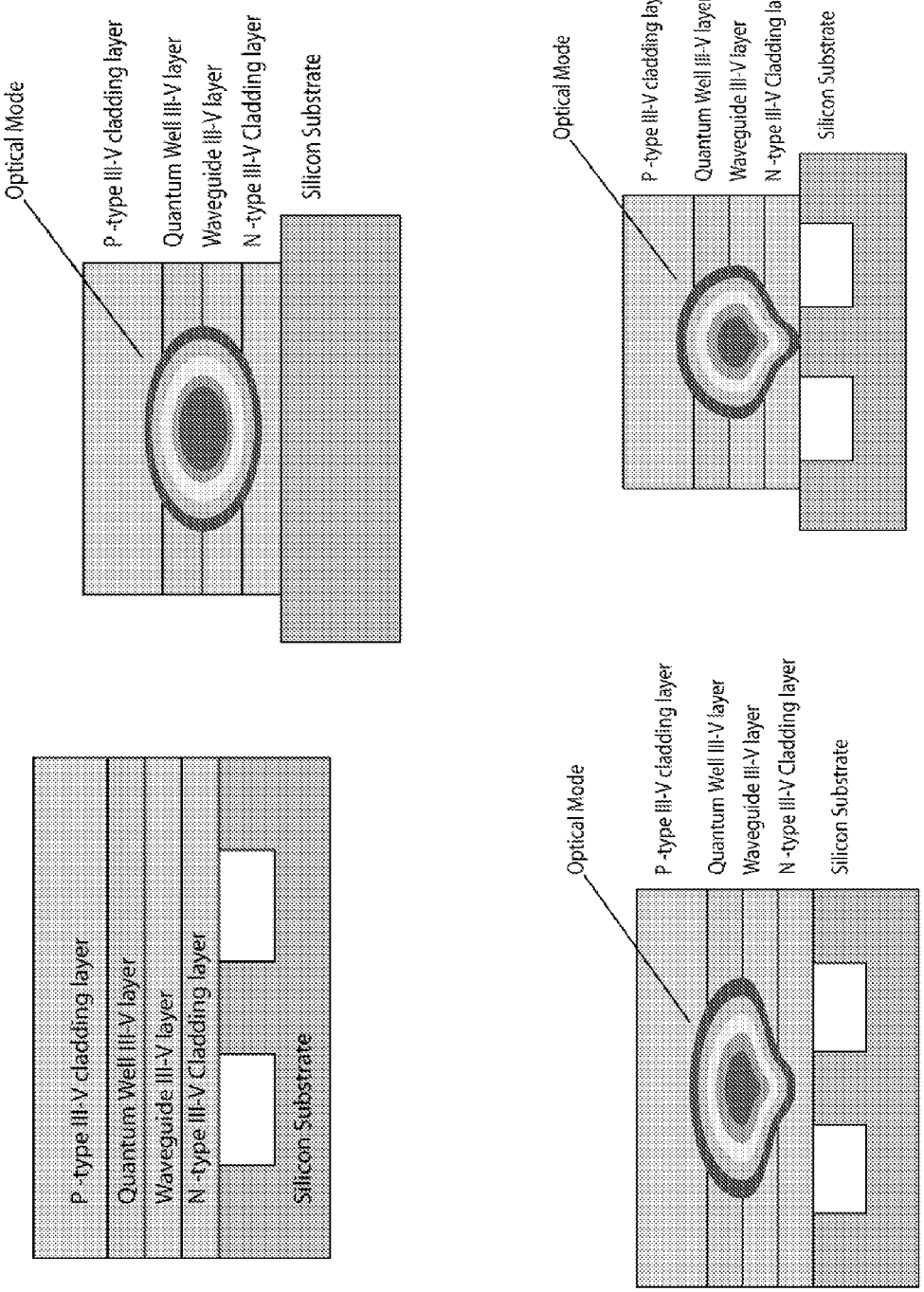
FIG. 13 illustrates the lateral confinement of the mode coming from patterning the silicon layer, patterning the III-V layers, or both, in accordance with the present invention.

Finally, the lateral confinement of the mode can come from patterning the silicon layer, patterning the III-V layers, or both, as shown in FIG. 13.

Figure 14:
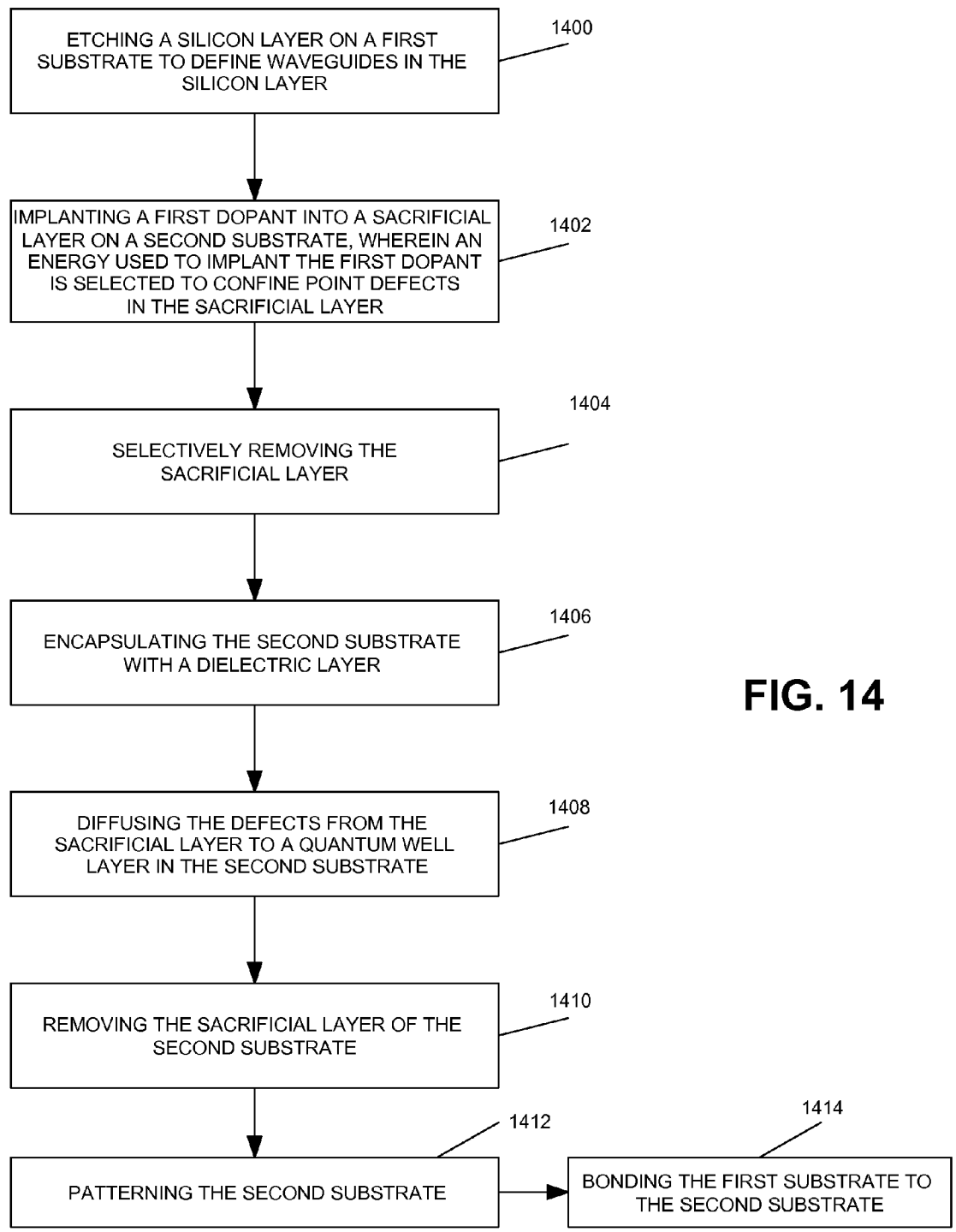
FIG. 14 illustrates a process chart in accordance with one or more embodiments of the present invention.

Although described with InP devices herein, other III-V structures, such as Gallium Arsenide structures, including AlGaAs, AlGaInAs, and other structures using Ga and As, as well as indium antimonide and other III-V structures are also possible within the scope of the present invention. II-VI structures, and other compound semiconductor structures and substrates, are also possible for use within the scope of the present invention.

Process Chart FIG. 14 illustrates a process chart in accordance with one or more embodiments of the present invention.

Box 1400 illustrates etching a silicon layer on a first substrate to define waveguides in the silicon layer.

Box 1402 illustrates implanting a first dopant into a sacrificial layer on a second substrate, wherein an energy used to implant the first dopant is selected to confine point defects in the sacrificial layer.

Box 1404 illustrates selectively removing the sacrificial layer.

Box 1406 illustrates encapsulating the second substrate with a dielectric layer.

Box 1408 illustrates diffusing the defects from the sacrificial layer to a quantum well layer in the second substrate.

Box 1410 illustrates removing the sacrificial layer of the second substrate.

Box 1412 illustrates patterning the second substrate.

Box 1414 illustrates bonding the first substrate to the second substrate.

REFERENCES

The following references are incorporated by reference herein:

[1] E. J. Skogen, "Quantum Well Intermixing for Wavelength-Agile Photonic Integrated Circuits," Ph.D. Thesis, University of California, Santa Barbara, June 2003.

[2] A. W. Fang, R. Jones, H. Park, O. Cohen, O. Raday, M. J. Paniccia, and J. E. Bowers, "Integrated AlGaInAs-silicon evanescent race track laser and photodetector," Opt. Express 15(5), 2315-2322 (2007).

[3] M. N. Sysak et al., "Single-Chip, Widely-Tunable 10 Gbps Photocurrent-Driven Wavelength Converter Incorporating a Monolithically Integrated Laser Transmitter and Optical Receiver," IEE Electronics Lett., Vol. 42, No. 11, pp. 657-658, May, 2006.

[4] M. N. Sysak, et al., "Broadband Return to Zero (RZ) Signal Regeneration and Wavelength Conversion Using a Monolithically Integrated, Photocurrent Driven Wavelength Converter," IEE Electronics Lett. Vol. 42, No. 25, December 2006.

[5] H. Park et al., "Hybrid Silicon Evanescent Laser Fabricated With a Silicon Waveguide and III-V Offset Quantum Wells," Opt. Express 13(23) 9460-9464, November, 2005.

[6] A. W. Fang et al., "A Continuous Wave Hybrid AlGaInAs-Silicon Evanescent Laser," IEEE Photonics Technology Letters 18(10) 1143-1145, May 2006.

[7] A. W. Fang et al., "Continuous Wave Electrically Pumped Hybrid Silicon Evanescent Laser," Opt. Express 14, 9203, October 2006.

[8] H. Park et al., "A Hybrid AlGaInAs-Silicon Evanescent Amplifier," IEEE Photonics Technology Letters 19(4), 230-232, February 2007.

[9] H. Park et al., "A Hybrid AlGaInAs-Silicon Evanescent Waveguide Photodetector," Opt. Express 15(10), 6044-6052, May 2007.

[10] A. Fang et al., "Hybrid Silicon Evanescent Devices," Materials Today, 2007.

[11] H. Park et al., "An Optically Pumped Silicon Evanescent Laser," 31$^{st}$ European Conference on Optical Communications (ECOC 2005), SECC, Glasgow, Scotland, September 2005.

[12] S. Kodama et al., "Novel Laser Diode Structure consisting of a Si Waveguide and Compound Semiconductor MQW layers for Si Platform Integration," Proceedings of International Conference on Solid State Devices and Materials, Kobe, Japan, Sep. 12-15, 2005.

[13] A. W. Fang et al., "Heterogeneous Integration of Silicon and AlGaInAs for a Silicon Evanescent Laser," Photonics West, Feb. 7, 2006.

[14] H. Park et al., "An Optically Pumped Silicon Evanescent Laser Operating Continuous Wave at 60 C," paper OWH2, Optical Fiber Communication Conference (OFC '06) March, 2006.

[15] J. E. Bowers et al., "A Technology for Integrating Active Photonic Devices on SOI Wafers," IPRM, May 7-11, 2006.

[16] J. E. Bowers et al., "Hybrid Silicon Evanescent Laser," Device Research Conference 2006, University Park, Pa., Jun. 20, 2006.

[17] J. E. Bowers et al., "Design of Hybrid Silicon Evanescent Amplifiers," COIN-NGN, Korea, July, 2006.

[18] J. E. Bowers et al., "Silicon Evanescent Lasers and Amplifiers," 2006 IEEE/LEOS Group IV Photonics Conference, paper TuA1, Ottawa, Canada, Sep. 13-15, 2006.

[19] H. Park et al., "40 C+ Continuous-Wave Electrically Pumped Hybrid Silicon Evanescent Laser," IEEE 20$^{th}$ International Semiconductor Laser Conference, paper PD1.3, Kohala, Hi., Sep. 17-21, 2006.

[20] J. E. Bowers et al., "Scalable Wafer Bonding for Photonic Devices on Silicon," LEOS Annual Meeting, paper TuC1, Oct. 29-Nov. 2, 2006.

[21] J. E. Bowers et al., "Silicon Evanescent Photonic Integrated Circuits," IEDMS, Plenary Talk, Tainen, Taiwan, Dec. 7, 2006.

[22] H. Park et al., "An Electrically Pumped Hybrid Silicon Evanescent Amplifier," OFC, paper OTuD2, Anaheim, Calif., Mar. 27-29, 2007.

[23] J. Bowers et al., "Silicon Evanescent Laser in a Silicon-on-Insulator Waveguide," OFC, Invited Paper, paper OTuK4, Anaheim, Calif., Mar. 27-29, 2007.

[24] J. Bowers, "Hybrid Silicon Evanescent Photonic Integrated Circuits," CLEO, Invited Paper, Baltimore, Md., May 8-10, 2007.

[25] J. E. Bowers, "Hybrid Silicon Laser by Wafer Bonding," IPRA, Invited Paper, Goteborg, Sweden, Jul. 8-13, 2007.

[26] D. Liang et al., "Low temperature Wafer Bonding for III-V Si Photonic Integrated Circuits," EMC 2007, Notre Dame, Ind., Jun. 20-22, 2007.

CONCLUSION

In summary, embodiments of the invention provide methods for making optical devices integrated with silicon electronics.

A silicon laser intermixed integrated device in accordance with one or more embodiments of the present invention comprises a silicon-on-insulator substrate, comprising at least one waveguide in a top surface, and a compound semiconductor substrate comprising a gain layer, the compound semiconductor substrate being subjected to a quantum well intermixing process, wherein the upper surface of the compound semiconductor substrate is bonded to the top surface of the silicon-on-insulator substrate.

Such a device further optionally comprises the waveguide in the top surface being substantially orthogonal to a grating in the upper surface, electrical isolation being achieved by proton implantation, the compound semiconductor substrate comprising at least one laser that is integrated with the silicon-on-insulator substrate without individual placement of the laser, the compound semiconductor substrate further comprising at least one modulator, the compound semiconductor substrate being encapsulated in a dielectric material and annealed to interdiffuse defects into the gain layer, the integrated device being a wavelength converter integrated with an electroabsorption modulator, the integrated device comprising an optical amplifier, the integrated device being a tunable laser integrated with a semiconductor optical amplifier and an electroabsorption modulator, and the integrated device being a photodetector integrated with a semiconductor optical amplifier.

A silicon laser-quantum well intermixing integrated device in accordance with one or more embodiments of the present invention comprises a silicon substrate, comprising a top surface, and a compound semiconductor substrate comprising a quantum well layer and a waveguide layer, the compound semiconductor substrate being subjected to a quantum well intermixing process, an upper surface of the compound semiconductor substrate comprising a grating, wherein the upper surface of the compound semiconductor substrate is bonded to the top surface of the silicon substrate.

Such a device further optionally comprises the waveguide layer being substantially orthogonal to the grating, and the compound semiconductor substrate being encapsulated in a dielectric material and annealed to interdiffuse defects into the quantum well layer.

A method for making a silicon laser-quantum well intermixing integrated device in accordance with one or more embodiments of the present invention comprises etching a silicon layer on a first substrate to define waveguides in the silicon layer, implanting a first dopant into a sacrificial layer on a second substrate, wherein an energy used to implant the first dopant is selected to confine point defects in the sacrificial layer, selectively removing the sacrificial layer, encapsulating the second substrate with a dielectric layer, diffusing the defects from the sacrificial layer to a quantum well layer in the second substrate, removing the sacrificial layer of the second substrate, patterning the second substrate, and bonding the first substrate to the second substrate.

Such a method further optionally comprises diffusing the defects from the sacrificial layer to a quantum well layer in the second substrate alters the shape of at least one quantum well in the quantum well layer, removing the sacrificial layer of the second substrate stops the diffusion of the defects from the sacrificial layer to the quantum well layer, the diffusion of the defects from the sacrificial layer to the quantum well layer being stopped when a desired bandgap of the quantum well layer is reached, the first substrate being a silicon substrate, and the second substrate being a III-V substrate.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but by the claims appended hereto which form a part of this application, and by the full range of equivalents of the appended claims.

What is claimed is:

1. A photonic device comprising:
    a silicon-on-insulator substrate comprising a silicon layer that includes a first waveguide; and
    a compound semiconductor structure comprising:
        a first layer comprising a p-type compound semiconductor;
        a second layer comprising an n-type compound semiconductor; and
        a multiple-quantum-well (MQW) layer that is between the first layer and the second layer, the MQW layer being characterized by an as-grown bandgap, the MQW layer including a first region having a first bandgap that is shifted by a first shift from the as-grown bandgap, the first shift being based on an ion-implanted layer proximate to the second layer and distal to the first layer;
    wherein the compound semiconductor structure and the first waveguide are bonded such that the MQW layer and the first waveguide are optically coupled and the second layer is proximate to the first waveguide.

2. The photonic device of claim 1, wherein the first bandgap is based on defect diffusion from the ion-implanted layer to the MQW layer, wherein the defects diffuse through the second layer.

3. The photonic device of claim 1, wherein the MQW layer further comprises a second region having a second bandgap that is shifted by a second shift from the as-grown bandgap, the second shift being based on the ion-implanted layer, wherein the second bandgap is different than the first bandgap.

4. The photonic device of claim 1 further comprising a hybrid silicon laser that includes the first region.

5. The photonic device of claim 4 further comprising a modulator that includes the second region.

6. The photonic device of claim 1 further comprising a hybrid silicon laser, the MQW layer including a second region, and the hybrid silicon laser including the second region.

7. The photonic device of claim 1, further comprising a grating structure that is optically coupled with the first waveguide.

8. The photonic device of claim 1, wherein the compound semiconductor structure further comprises third layer that is between the MQW layer and the second layer, the third layer comprising a compound semiconductor superlattice, and the third layer being operable for inhibiting migration of defects between the MQW layer and second layer after the compound semiconductor structure and the first waveguide are bonded.

9. The photonic device of claim 1, wherein an optical mode is resident in both the compound semiconductor structure and the first waveguide, and wherein the majority of the optical mode resides in the compound semiconductor structure.

10. A silicon evanescent photonic device comprising:
    a silicon layer that includes a first waveguide;
    a first layer bonded to the silicon layer, the first layer comprising an n-type compound semiconductor;
    a second layer comprising a p-type compound semiconductor;
    a MQW layer that is between the first layer and the second layer, the MQW layer being characterized by an as-grown bandgap;
    a third layer that is between the MQW layer and the first layer, the third layer comprising a superlattice, and the third layer being operable for inhibiting migration of defects between the MQW layer and the first layer after the first layer and the silicon layer are bonded; and
    a first region comprising a first portion of the MQW layer, the first portion having a first bandgap that is shifted from the as-grown bandgap.

11. The photonic device of claim 10, wherein the first layer and silicon layer are bonded via a wafer-level bonding process.

12. The photonic device of claim 10, wherein the bandgap of each of the first region is shifted by quantum-well intermixing through the first layer.

13. The photonic device of claim 12, wherein the quantum-well intermixing induces defect diffusion from an ion-implanted layer into the MQW layer through the first layer.

14. The photonic device of claim 10, further comprising a laser having a gain region that includes a second portion of the MQW layer.

15. The photonic device of claim 14, further comprising a modulator, the modulator including the first region.

16. The photonic device of claim 10, further comprising a device selected from the group consisting of an amplifier, a mirror, modulator, a photodetector, and an absorber, the device including the first region.

17. The photonic device of claim 10 further comprising a compound semiconductor structure that comprises the first layer, the second layer, and the MQW layer, wherein an optical mode is resident in both the compound semiconductor structure and the first waveguide, and wherein the majority of the optical mode resides in the compound semiconductor structure.

18. A method comprising:
   (1) providing a first substrate having a compound semiconductor structure that includes:
      (a) a first layer comprising an p-type compound semiconductor;
      (b) a second layer comprising a n-type compound semiconductor; and
      (c) an MQW layer that is between the first layer and second layer;
      wherein the first layer is proximate to a base substrate, and wherein the second layer is distal to the base substrate, and further wherein the MQW layer is characterized by an as-grown bandgap;
   performing a first quantum-well intermixing process to shift the bandgap of a first region of the MQW layer to a first bandgap, the first quantum-well intermixing process being performed through the second layer;
   bonding the first substrate to a second substrate having a silicon layer that includes a first waveguide, wherein the first substrate is bonded to the second substrate such that the second layer is proximate to the first waveguide and the MQW layer and first waveguide are optically coupled; and
   removing the base substrate.

19. The method of claim 18, wherein the first quantum-well intermixing process induces diffusion of defects through the second layer and into the first region of the MQW layer.

20. The method of claim 18 further comprising forming a device selected from the group consisting of a laser, a modulator, an amplifier, a photodetector, an absorber, and a mirror, wherein the device includes a first segment of the MQW layer and a first segment of the first waveguide.

21. The method of claim 20 wherein the device is formed such that the first segment of the MQW layer includes the first region of the MQW layer.

22. The method of claim 18 further comprising performing a second quantum-well intermixing process to shift the bandgap of a second region of the MQW layer to a second bandgap that is different than the first bandgap.

23. The method of claim 22 further comprising:
   forming a first device selected from the group consisting of a laser, a modulator, an amplifier, a photodetector, an absorber, and a mirror, wherein the first device includes a first segment of the MQW layer and a first segment of the first waveguide;
   forming a second device selected from the group consisting of a laser, a modulator, an amplifier, a photodetector, an absorber, and a mirror, wherein the second device includes a second segment of the MQW layer and a second segment of the first waveguide; and
   forming a third device selected from the group consisting of a laser, a modulator, an amplifier, a photodetector, an absorber, and a mirror, wherein the third device includes a third segment of the MQW layer and a third segment of the first waveguide;
   wherein the first segment of the MQW layer includes the first region of the MQW layer, and wherein the second segment of the MQW layer includes the second region of the MQW layer.

24. The method of claim 18 wherein the first substrate is provided such that it further includes (d) a third layer that is between the MQW layer and the second layer, and wherein the third layer comprises a compound semiconductor superlattice that is operable for inhibiting migration of defects between the MQW layer and second layer after the compound semiconductor structure and the first waveguide are bonded.

25. The method of claim 18 further comprising forming a grating structure that is optically coupled with the first waveguide.

26. The method of claim 18 wherein the first substrate and second substrate are bonded such that an optical mode residing in both the compound semiconductor structure and the first waveguide resides more in the compound semiconductor structure than in the first waveguide.

* * * * *